United States Patent
Kubota et al.

(10) Patent No.: US 7,262,677 B2
(45) Date of Patent: Aug. 28, 2007

(54) FREQUENCY FILTERING CIRCUIT FOR WIRELESS COMMUNICATION DEVICES

(75) Inventors: Kanya Kubota, Shiga-ken (JP); Ikuroh Ichitsubo, Kanagawa Prefecture (JP)

(73) Assignee: Micro-Mobio, Inc., Palo-Alto, CA (US)

( * ) Notice: Subject to any disclaimer, the term of this patent is extended or adjusted under 35 U.S.C. 154(b) by 0 days.

(21) Appl. No.: 10/972,858

(22) Filed: Oct. 25, 2004

(65) Prior Publication Data

US 2006/0087387 A1   Apr. 27, 2006

(51) Int. Cl.
*H01P 1/203* (2006.01)

(52) U.S. Cl. .................. 333/204; 333/134
(58) Field of Classification Search .......... 333/134, 333/175, 176, 203–205, 126
See application file for complete search history.

(56) References Cited

U.S. PATENT DOCUMENTS

| | | |
|---|---|---|
| 4,977,041 A | 12/1990 | Shiozawa et al. |
| 5,050,238 A | 9/1991 | Tomizuka |
| 5,164,683 A | 11/1992 | Shields |
| 5,255,324 A | 10/1993 | Brewer |
| 5,283,539 A * | 2/1994 | Sadhir et al. ............. 333/28 R |
| 5,299,264 A | 3/1994 | Schotz et al. |
| 5,339,057 A | 8/1994 | Rauscher |
| 5,363,073 A | 11/1994 | Higgins |
| 5,483,195 A | 1/1996 | Brown |
| 5,491,604 A | 2/1996 | Nguyen et al. |
| 5,548,239 A | 8/1996 | Kohama |
| 5,581,617 A | 12/1996 | Schotz et al. |
| 5,608,364 A * | 3/1997 | Hirai et al. ............. 333/204 |
| 5,625,894 A | 4/1997 | Jou |
| 5,656,972 A | 8/1997 | Norimatsu |
| 5,697,087 A * | 12/1997 | Miya et al. ............. 455/307 |
| 5,732,334 A | 3/1998 | Miyake |
| 5,825,227 A | 10/1998 | Kohama |
| 5,835,990 A | 11/1998 | Saw et al. |
| 5,880,635 A | 3/1999 | Satoh |
| 5,955,932 A | 9/1999 | Nguyen et al. |
| 5,969,560 A | 10/1999 | Kohama |
| 5,983,089 A | 11/1999 | Mohwinkel et al. |
| 6,025,651 A | 2/2000 | Nam |
| 6,075,995 A | 6/2000 | Jensen |

(Continued)

FOREIGN PATENT DOCUMENTS

JP     2001053502 A  *  2/2001

(Continued)

OTHER PUBLICATIONS

U.S. Appl. No. 10/385,059, filed Feb. 7, 2005, Ikuroh Ichitsubo.

(Continued)

*Primary Examiner*—Seungsook Ham
(74) *Attorney, Agent, or Firm*—Tran & Associates

(57) ABSTRACT

Systems and methods are disclosed for a frequency filtering circuit for wireless communications that includes a first resonator circuit comprising a first transmission line and a first capacitor coupled to the first transmission line and a second resonator circuit in parallel to the first resonator circuit, said second resonator circuit comprising a second transmission line and a second capacitor coupled to the second transmission line. A coupling circuit couples the first resonator circuit and the second resonator circuit.

26 Claims, 8 Drawing Sheets

U.S. PATENT DOCUMENTS

| | | | |
|---|---|---|---|
| 6,118,985 A | 9/2000 | Kawakyu | |
| 6,148,220 A | 11/2000 | Sharp | |
| 6,151,509 A | 11/2000 | Chorey | |
| 6,161,003 A | 12/2000 | Lo Curto et al. | |
| 6,175,279 B1 | 1/2001 | Ciccarelli | |
| 6,183,703 B1 | 2/2001 | Hsu | |
| 6,198,351 B1 | 3/2001 | Winslow | |
| 6,203,587 B1 | 3/2001 | Lesieur | |
| 6,236,281 B1 | 5/2001 | Nguyen et al. | |
| 6,262,630 B1 | 7/2001 | Eriksson | |
| 6,265,943 B1 | 7/2001 | Dening | |
| 6,265,954 B1 * | 7/2001 | Krause | 333/204 |
| 6,281,755 B1 | 8/2001 | Feld | |
| 6,281,762 B1 | 8/2001 | Nakao | |
| 6,294,967 B1 * | 9/2001 | Hirai et al. | 333/202 |
| 6,308,048 B1 | 10/2001 | Gore et al. | |
| 6,326,866 B1 * | 12/2001 | Sasaki et al. | 333/203 |
| 6,366,788 B1 | 4/2002 | Fujioka | |
| 6,417,730 B1 | 7/2002 | Segallis et al. | |
| 6,462,622 B1 | 10/2002 | Mori | |
| 6,483,398 B2 | 11/2002 | Nagamori | |
| 6,496,684 B2 | 12/2002 | Nakao | |
| 6,625,050 B2 | 9/2003 | Suwa | |
| 6,630,372 B2 | 10/2003 | Ball | |
| 6,639,466 B2 | 10/2003 | Johnson | |
| 6,677,833 B2 * | 1/2004 | Sheen | 333/132 |
| 6,678,506 B1 | 1/2004 | Dolman | |
| 6,683,512 B2 * | 1/2004 | Nakamata et al. | 333/126 |
| 6,693,498 B1 | 2/2004 | Sasabata | |
| 6,694,129 B2 | 2/2004 | Peterzell | |
| 6,696,898 B1 | 2/2004 | Ward et al. | |
| 6,696,903 B1 * | 2/2004 | Kawahara et al. | 333/134 |
| 6,720,850 B2 | 4/2004 | Sasabata | |
| 6,762,659 B2 * | 7/2004 | Son et al. | 333/203 |
| 6,774,718 B2 | 8/2004 | Ichitsubo | |
| 6,798,287 B2 | 9/2004 | Wu | |
| 6,808,954 B2 | 10/2004 | Ma et al. | |
| 6,822,515 B2 | 11/2004 | Ichitsubo | |
| 6,833,775 B2 * | 12/2004 | Buck et al. | 333/204 |
| 6,847,262 B2 | 1/2005 | Ichitsubo | |
| 6,847,269 B2 * | 1/2005 | Watanabe et al. | 333/126 |
| 6,911,942 B2 * | 6/2005 | Fukuda et al. | 343/700 MS |
| 6,914,482 B2 | 7/2005 | Ichitsubo | |
| 7,071,783 B2 | 7/2006 | Ichitsubo | |
| 2004/0203552 A1 | 10/2004 | Horiuchi et al. | |
| 2005/0179498 A1 | 8/2005 | Tsutsui et al. | |
| 2006/0164188 A1 * | 7/2006 | Yamada | 333/204 |

FOREIGN PATENT DOCUMENTS

WO    WO 2004049495 A1 *   6/2004

OTHER PUBLICATIONS

U.S. Appl. No. 10/804,737, filed Mar. 18, 2004, Ikuroh Ichitsubo.
U.S. Appl. No. 10/843,409, filed May 10, 2004, Ikuroh Ichitsubo.
U.S. Appl. No. 10/919,850, filed Aug. 16, 2004, Shinsuke Inul.
U.S. Appl. No. 10/938,779, filed Sep. 10, 2004, Ikuroh Ichitsuho.
U.S. Appl. No. 10/972,636, filed Oct. 24, 2004, Kanye Kubota.
U.S. Appl. No. 11/039,687, filed Jan. 19, 2005, Ikuroh Ichitsubo.
U.S. Appl. No. 11/064,261, filed Feb. 24, 2005, Ikuroh Ichitsubo.
U.S. Appl. No. 11/110,249, filed Apr. 20, 2005, Ikuroh Ichitsubo.
U.S. Appl. No. 11/121,288, filed May 2, 2005, Ikuroh Ichitsubo.
U.S. Appl. No. 11/126,667, filed May 11, 2005, Ikuroh Ichitsubo.
U.S. Appl. No. 11/152,308, filed Jun. 14, 2005, Ikuroh Ichitsubo.
U.S. Appl. No. 11/173,741, filed Jul. 2, 2005, Ikuroh Ichitsubo.
U.S. Appl. No. 11/173,965, filed Jul. 2, 2005, Ikuroh Ichitsubo.
U.S. Appl. No. 11/173,968, filed Jul. 2, 2005, Ikuroh Ichitsubo.
U.S. Appl. No. 11/323,763, filed Dec. 30, 2005, Ikuroh Ichitsubo.
U.S. Appl. No. 11/323,788, filed May 12, 2006, Ikuroh Ichitsubo.
U.S. Appl. No. 11/433,896, filed Jul. 14, 2006, Ikuroh Ichitsubo.
U.S. Appl. No. 11/486,465, filed Jul. 14, 2006, Ikuroh Ichitsubo.

* cited by examiner

FREQUENCY FILTERING CIRCUIT FOR WIRELESS COMMUNICATION DEVICES

The application is related to the commonly assigned U.S. patent application Ser. No. 10/041,863, filed on Oct. 22, 2001, titled "Multilayer RF Amplifier Module" which issued as U.S. Pat. No. 6,633,005, by Wang, et al., application Ser. No. 10/385,058, filed on Mar. 9, 2003, titled "Power Amplifier Module for Wireless Communication Devices" which issued as U.S. Pat. No. 6,774,718, U.S. patent application Ser. No. 10/385,059, filed Mar. 9, 2004, "Accurate Power Sensing Circuit for Power Amplifiers" by Ichitsubo et al., U.S. patent application Ser. No. 10/804,737, filed Mar. 18, 2004, "RF front-end module for wireless communication devices" by Ichitsubo et al., and concurrently filed and commonly assigned U.S. patent application "Diplexer circuit for wireless communication devices" by Kubota et al. The disclosures of these related applications are incorporated herein by reference.

BACKGROUND

The present invention relates to radio frequency (RF) communication devices. In particular, the transmission and reception of wireless signals at different frequency bands. Portable devices such as laptop personal computers (PC), Personal Digital Assistant (PDA) and cellular phones with wireless communication capability are being developed in ever decreasing size for convenience of use. Correspondingly, the electrical components thereof must also decrease in size while still providing effective radio transmission performance. However, the substantially high transmission power associated with RF communication increases the difficulty of miniaturization of the transmission components.

A major component of a wireless communication device is the radio frequency power amplifier. The PA is conventionally in the form of a semiconductor integrated circuit (IC) chip or die in which signal amplification is effected with substantial power. The amplifier chip is interconnected in a circuit with certain off-chip components such as inductors, capacitors, resistors, and transmission lines used for controlling operation of the amplifier chip and providing impedance matching of the input and output RF signals. The amplifier chip and associated components are typically assembled, on a printed circuit board (PCB) in which the components are interconnected by layers printed metal circuits and layers of dielectric substrates.

Another desirable function for wireless communication devices is the capability to transmit and receive wireless signals at more than one frequency bands. The wireless communication devices need to switch between the reception mode and the transmission modes of operations. The wireless communication devices are also required to select signals from a plurality of different band frequencies and to receive or transmit signals at high signal-to-noise ratios.

There is a need to provide a wireless communication device that can fulfill the above functions and is also compact, simple and low cost.

SUMMARY

In one aspect, systems and methods are disclosed for a frequency filtering circuit for wireless communications, comprising
 a first resonator circuit comprising a first transmission line and a first capacitor coupled to the first transmission line;
 a second resonator circuit in parallel to the first resonator circuit, said second resonator circuit comprising a second transmission line and a second capacitor coupled to the second transmission line; and
 a coupling circuit that couples the first resonator circuit and the second resonator circuit.

In another aspect, systems and methods are disclosed for a wireless communications device, comprising:
 a semiconductor substrate;
 a frequency filtering circuit, comprising
 a first resonator circuit comprising and a first transmission line fabricated on the semiconductor substrate and a first capacitor coupled to the first transmission line;
 a second resonator circuit in parallel to the first resonator circuit, said second resonator circuit comprising a second transmission line fabricated on the semiconductor substrate and a second capacitor coupled to the second transmission line; and
 a coupling circuit that couples the first resonator circuit and the second resonator circuit.

Implementations of the device may include one or more of the following. A frequency filtering circuit for wireless communications includes a first resonator circuit comprising a first transmission line and a first capacitor coupled to the first transmission line and a second resonator circuit in parallel to the first resonator circuit, said second resonator circuit comprising a second transmission line and a second capacitor coupled to the second transmission line. A coupling circuit couples the first resonator circuit and the second resonator circuit. The coupling circuit may include a third capacitor and a first inductor in parallel to the third capacitor, wherein the third capacitor and the first inductor are coupled to the first transmission line and the second transmission line. The frequency filtering circuit can further comprise a second inductor that is connected grounded at one end and is coupled with the first capacitor and the second capacitor at another end. The first transmission line can be grounded at first end and is connected to the first capacitor at the second end. The coupling circuit can couple with the first resonator circuit at the first end of the first transmission line. The second transmission line can be grounded at first end and is connected to the second capacitor at the second end. The coupling circuit can couple with the second resonator circuit at the first end of the second transmission line. The layout of first transmission line or the second transmission line can include a folded hairpin geometry. The layout of the first transmission line and the second transmission line can include substantially symmetric folded hairpin geometries. The length of the first transmission line can be substantially one quarter of the wavelength of the resonant frequency of the first resonator circuit. The frequency filtering circuit can further comprise input electric signals provided to the first resonator circuit and output electric signals received from the second resonator circuit in response to the input electric signals, wherein the frequency performance function of the output electric signals includes at least one downward notch at a frequency adjacent to one side of the pass band. The frequency performance function of the output electric signals may form a pass band around a peak frequency. The peak frequency may be about 2 GHz or 5 GHz.

Embodiments may include one or more of the following advantages. The described systems and methods provide integrated and compact designs for a wireless communication device that can receive wireless signals, amplify the signals, and select signals from signals at a plurality of different frequencies. Integrated and compact designs for wireless communication devices are also disclosed for selecting electronic signals from signals at a plurality of different frequencies, amplify the signals, and transmit wireless signals. The amplifiers and band-selecting diplexers can be laid out such that the number of amplifiers is decreased and the signal-to-noise ratios are significantly increased.

Frequency filtering circuits have the novel designs of using existing transmission lines as part of resonator circuits to save footprint and costs. The coupling between different resonator circuits produces superior frequency band-pass performance responses.

The details of one or more embodiments are set forth in the accompanying drawings and in the description below. Other features, objects, and advantages of the invention will become apparent from the description and drawings, and from the claims.

BRIEF DESCRIPTION OF THE DRAWINGS

In order that the manner in which the above recited and other advantages and features of the invention are obtained, a more particular description of the invention briefly described above will be rendered by reference to specific embodiments thereof, which are illustrated, in the appended drawings. Understanding that these drawings depict only typical embodiments of the invention and are not therefore to be considered to be limiting of its scope, the invention will be described and explained with additional specificity and detail through the use of the accompanying drawings in which.

The accompanying drawings, which are incorporated in and form a part of this specification, illustrate embodiments of the invention and, together with the description, serve to explain the principles of the invention.

DESCRIPTION OF INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
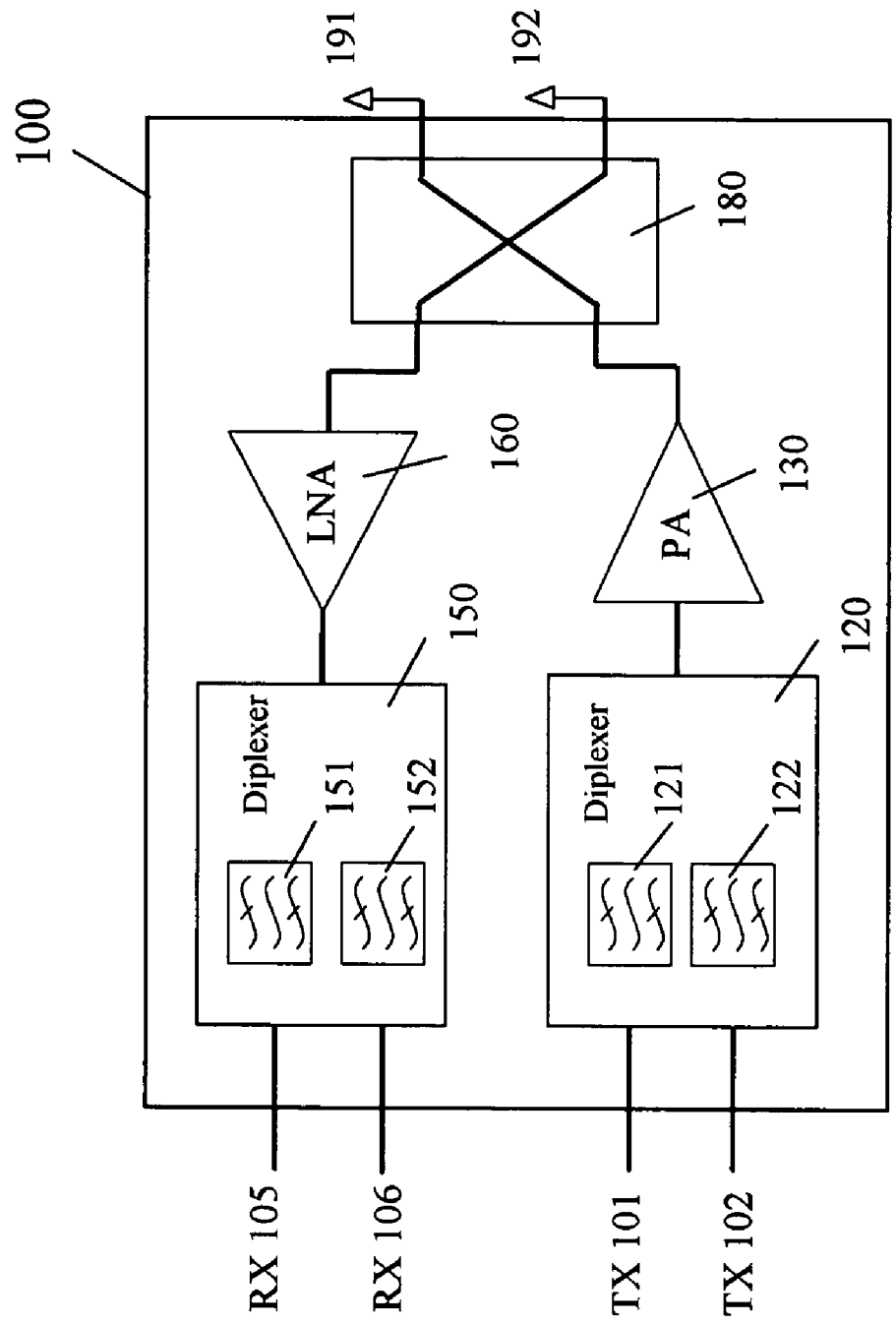
FIG. 1 shows an electrical schematic for a wireless module having amplifiers, diplexer, and frequency filtering circuits.
Figure 2:
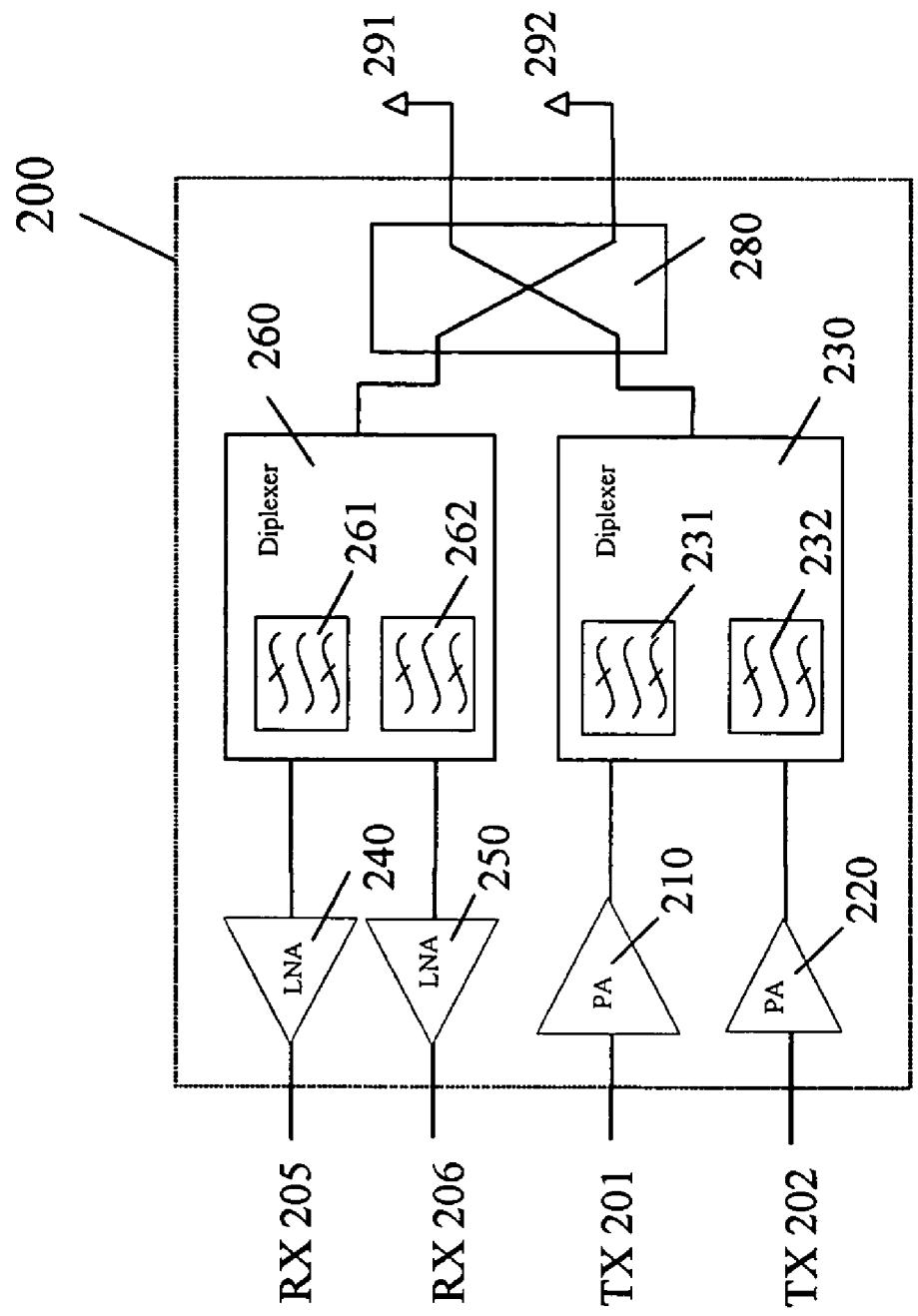
FIG. 2 shows another electrical schematic for a wireless module having amplifiers, diplexer, and frequency filtering circuits.

FIGS. 1 and 2 show electrical schematics for wireless module implementations having features including power and signal amplification amplifiers, frequency band selection, frequency filtering, and mode switching between transmission and reception. The circuit that is partitionable into circuits on an active and a passive substrate is shown with single-ended power amplifiers. In this embodiment is a dual band front-end module (FEM) for communications circuitry such as high performance 802.11 a/b/g wireless LAN circuits. The module can be a unitary device for wireless communications, and can include integrated power amplifiers (PAs), low noise amplifiers (LNAs), switches and other circuitry and auxiliary electronic components, for example. In one embodiment, the module integrates dual band power amplifiers, dual band low noise amplifiers, switch, diplexer, impedance matching networks, bias control, and power sensors to simplify design and production of end products. Bias control and compensation circuitry ensures stable performance over wide operating temperature range.

FIG. 1 shows an electrical schematic for a wireless module 100 having two input ports TX101 and TX 102 for transmitting signals at different frequencies, a diplexer 120 receiving input from input ports TX101 and TX 102 for selecting the different frequency bands, and a power amplifier 130 coupled with the diplexer 120. The diplexer 120 includes frequency filtering circuit 121 and frequency filtering circuit 122 for filtering the different frequency bands. The diplexer 120 and the miniaturized frequency filtering circuits 121,122 can be fabricated on an integrated circuit using semiconductor techniques.

In the reception branch, the wireless module 100 includes a low noise amplifier 160, a diplexer 150 coupled to the low noise amplifier 160. The diplexer 150 includes a frequency filtering circuit 151 and frequency filtering circuit 152. The diplexer 150 outputs electronic signals having different frequencies at output ports RX 105 and RX 106. The diplexer 150 and the miniaturized frequency filtering circuits 151,152 can be fabricated on an integrated circuit using semiconductor techniques.

The wireless module 100 includes an antenna 191 and an antenna 192 for receiving and transmitting wireless signals at different frequencies. The wireless signals can for example include Radio Frequency (RF) signals such as the bands at around 2.4 GHz and 5 GHz. The antenna 191 and the antenna 192 can be designed for transmitting and receiving wireless signals at common frequency bands.

The wireless module 100 includes a switch 180 that is coupled with the antenna 191, the antenna 192, the power amplifier 130, and the low noise amplifier 160. The switch 180 can switch between the transmission mode and the reception mode by selectively connecting the power amplifier 130 or the low noise amplifier 160 to the antenna 191 and the antenna 192.

One advantageous feature of the electrical circuit layout in FIG. 1 is in that the diplexer 120 is located upstream rather than down steam to the power amplifier 130. By inserting the diplexer 120 up steam to the power amplifier 130, the electronic signals at different frequencies can be first filtered and selected at low signal power level, and thus less amount of power loss. Only one power amplifier is needed to amplify the selected and filtered electronic signals output from the diplexer. In other words, electronic signals at different frequencies can share the same power amplifier rather than using a plurality of them. In comparison, if the diplexer comes down stream to the power amplifier, one power amplifier will be required for each frequency band. The design in FIG. 1 reduced the number of components and therefore decreases footprint and the cost in the wireless module 100.

Another advantageous feature of the electrical circuit layout in FIG. 1 is in that the low noise amplifier 160 is located upstream rather than down steam to the diplexer 150. By locating the low noise amplifier 160 upstream of the diplexer, the overall noise figure for the receiving system is reduced. Since wireless signals with different frequencies are amplified before the splitting into different frequency bands, there is no need for one low noise amplifier per frequency band. The number of amplifiers is reduced because only one low noise amplifier is used for all the frequency bands.

FIG. 2 shows another electrical schematic for a wireless module. Wireless module 200 includes two input ports TX201 and TX 202 for receiving transmission signals at different frequencies, power amplifier 210 and power amplifier 220 for respectively receiving and amplifying the input signals from input ports TX201 and TX 202, and a diplexer 230 coupled with power amplifiers 210,220 for selecting frequency bands from the amplified signals. The diplexer 230 includes frequency filtering circuit 231 and frequency filtering circuit 232 for filtering and selecting the different frequency bands after amplification. The diplexer 230 and the miniaturized frequency filtering circuits 231,232 can be fabricated on an integrated circuit using semiconductor techniques.

In the reception branch, the wireless module 200 includes low noise amplifiers 240 and 250 that coupled to a diplexer 260. The diplexer 260 includes a frequency filtering circuit 261 and a frequency filtering circuit 262, which can be built as an integral part of the diplexer circuit. The includes low noise amplifiers 240 and 250 respectively receive and amplify the elected signals having different frequency bands, and send amplified signals to the output ports RX 205 and RX 206.

The wireless module 200 includes an antenna 291 and an antenna 292 for receiving and transmitting wireless signals at different frequencies. For example, the antenna 291 and the antenna 292 can be designed for transmitting and receiving wireless signals at common frequency bands such as 2.4 GHz and 5 GHz. A switch 280 is coupled with the antenna 291, the antenna 292, the diplexer 230 and diplexer 260. The switch 280 can switch between the transmission mode and the reception mode by selectively connecting the diplexer 230 or diplexer 260 to the antenna 291 and the antenna 292.

In accordance with the present invention, the wireless module can further include a base band chip that generates digitally modulated signals. The frequency is up-converted by a RF transceiver to a RF frequency band suitable for transmitting. The RF signal is amplified by the power amplifier for transmitting by the antennas. The power amplifier can be turned ON/OFF by a power control signal. A bias circuits can also be controlled by the base band processor depending of the mode of power amplification. A power sensor can be included to measure the output power from the power amplifier. The output of the power sensor can be used by the base-band processor to set the transmitting power level for the wireless device by varying the RF input signal to PA module. Details of the PA module and the related circuitry are disclosed in the above mentioned Provisional Application Ser. No. 60/397,261, filed on Jul. 19, 2002, titled "Power Amplifier Modules for Wireless LAN Applications", the contents of which are incorporated by reference. The application is also related to the commonly assigned U.S. patent application Ser. No. 10/041,863, filed on Oct. 22, 2001, titled "Multilayer RF Amplifier Module" which issued as U.S. Pat. No. 6,633,005, by Wang. et al., application Ser. No. 10/385,058 filed on Mar. 9, 2003, titled "Power Amplifier Module for Wireless Communication Device". The disclosure of these application is incorporated herein by reference.

Figure 3:
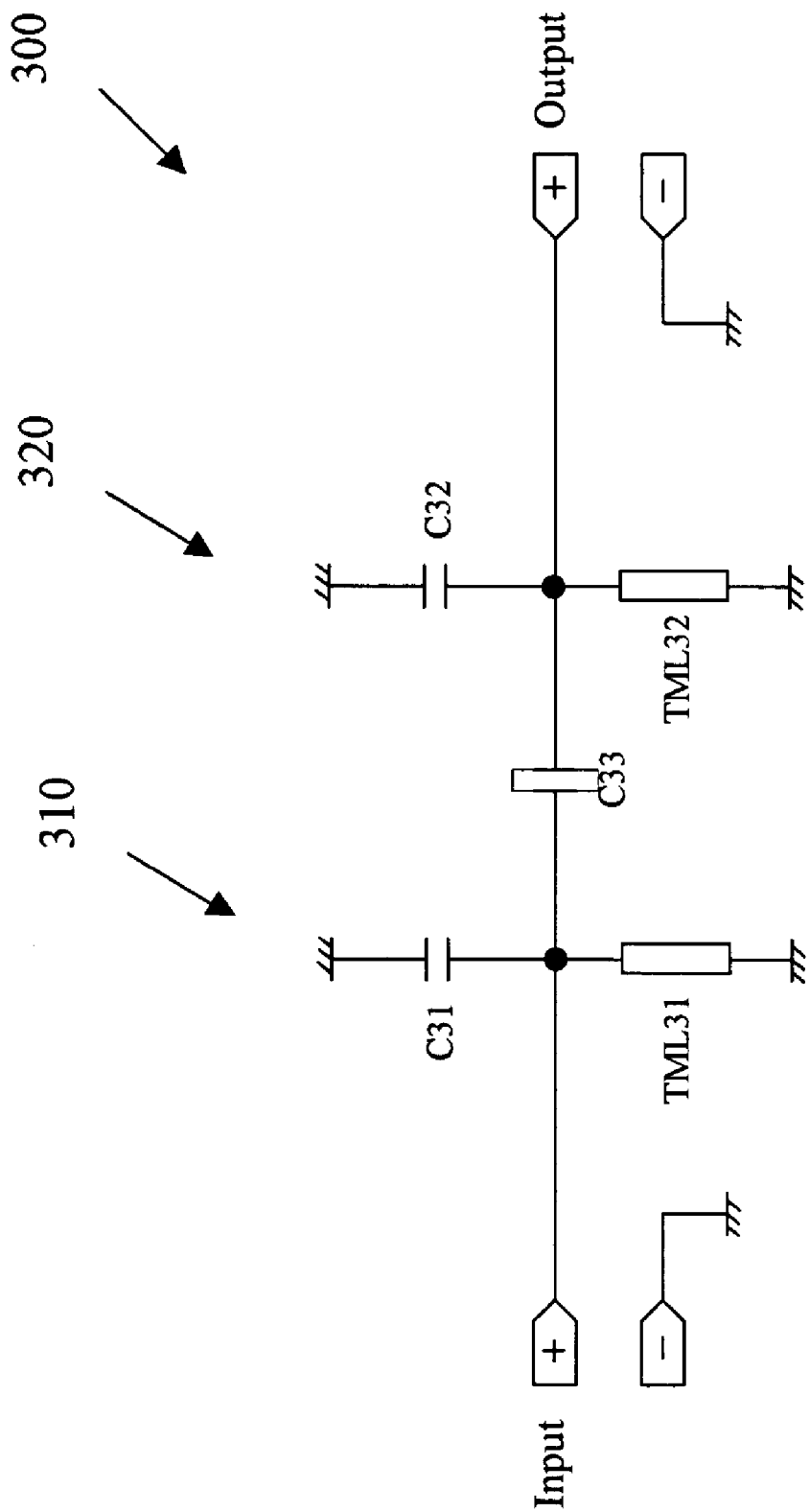
FIG. 3 illustrates an electrical schematic of a frequency filter circuit comprising transmission lines for wireless communications.

Details of the frequency-filtering circuits are now described. FIG. 3 illustrates an arrangement of a frequency filter circuit compatible with wireless modules 100, 200 in FIGS. 1 and 2. Frequency filter circuit 300 includes an input, an output, a first resonator circuit 310, and a second resonator circuit 320 in parallel to the first resonator circuit 310. The first resonator circuit 310 comprises a transmission line TML31 and a capacitor C31. The transmission line TML31 is coupled to the capacitor C31 at one end and ground at the other end. The second resonator circuit 320 includes a transmission line TML32 coupled to a capacitor C32. The transmission line TML32 and capacitor 32 are connected at the other ends. A capacitor C33 couples the first resonator circuit 310 and the second resonator circuit 320.

Figure 4:
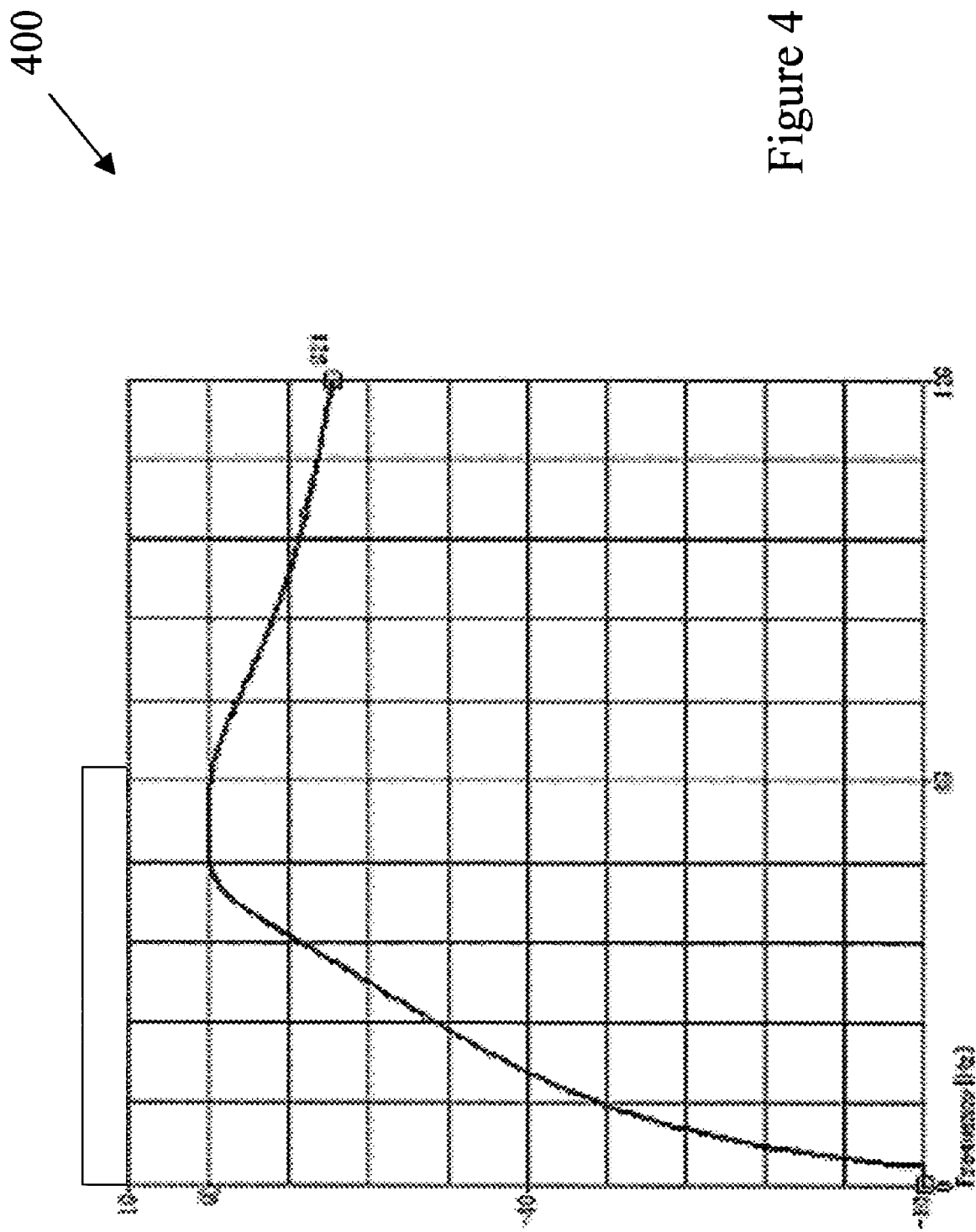
FIG. 4 illustrates the frequency response performance of the frequency filter circuit of FIG. 3.

The frequency response performance 400 of the frequency filter circuit 300 is shown in FIG. 4. The peak frequency defines the central frequency of the pass band. In accordance with the present invention, the frequency filtering circuits can produce a frequency pass band around a peak frequency such as 2 GHz or 5 GHz.

Figure 5:
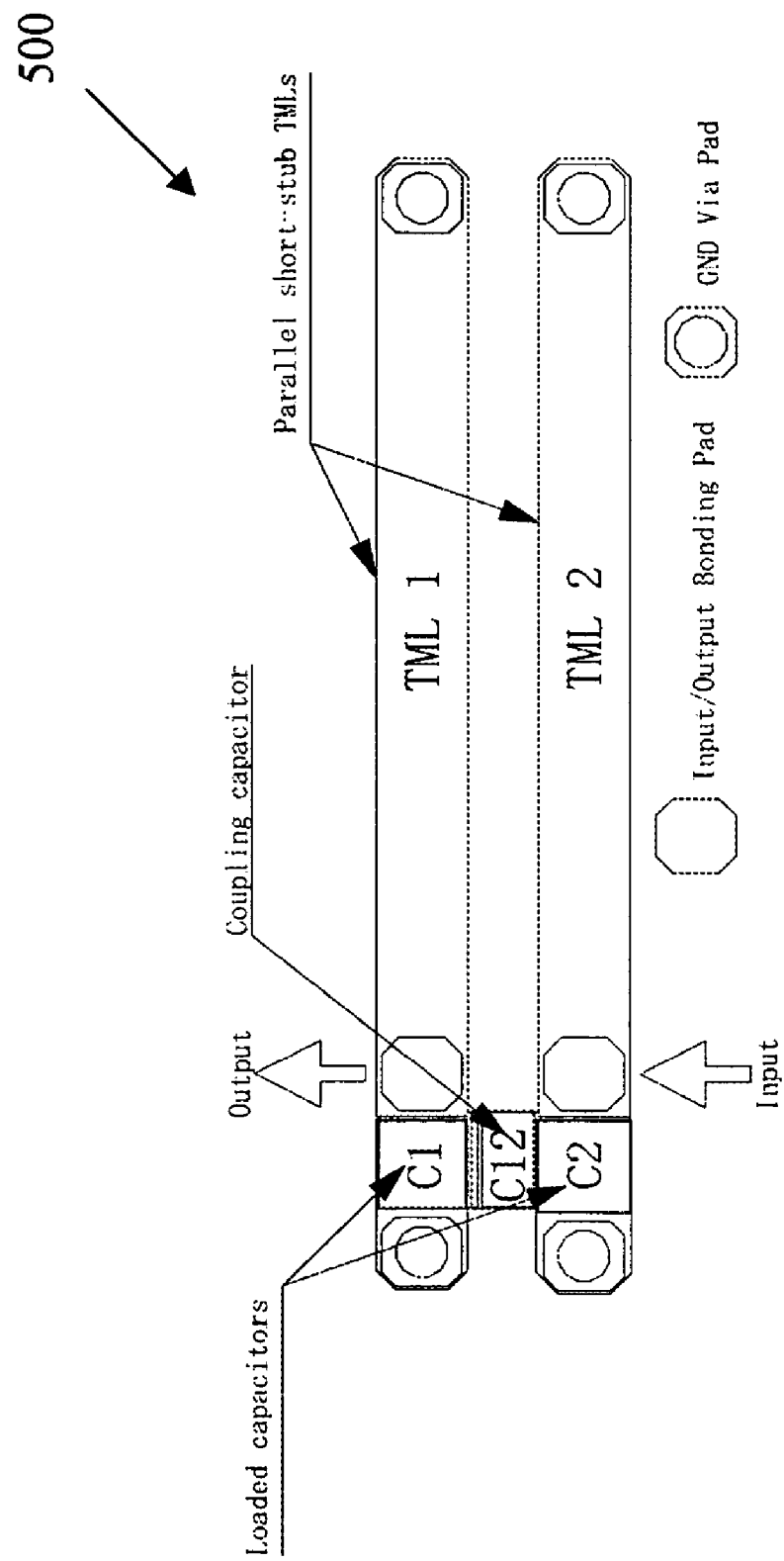
FIG. 5 illustrates a circuit layout of the frequency filter circuit of FIG. 3.

FIG. 5 illustrates a layout 500 as one implementation of the frequency filter circuit of FIG. 3 including coupled short-stub transmission line TML1 and capacitor C1 in the first resonator circuit, and coupled short-stub transmission line TML2 and capacitor C2 in the second resonator circuit. The capacitors C1,C2 and the transmission lines TML1, TML2 are grounded at the other ends. The two resonator circuits are coupled by capacitor C12. The layout of FIG. 4 can be conveniently implemented in an integrated circuit using semiconductor techniques. In one embodiment, the length of the transmission line TML1 has a length about one quarter of the resonance wavelength of the first resonator circuit. Similarly, the length of the transmission line TML2 has a length about one quarter of the resonance wavelength of the second resonator circuit. The precision of the semiconductor fabrication technologies can ensure the length of the transmission lines to be manufactured to very small tolerances.

Figure 6:
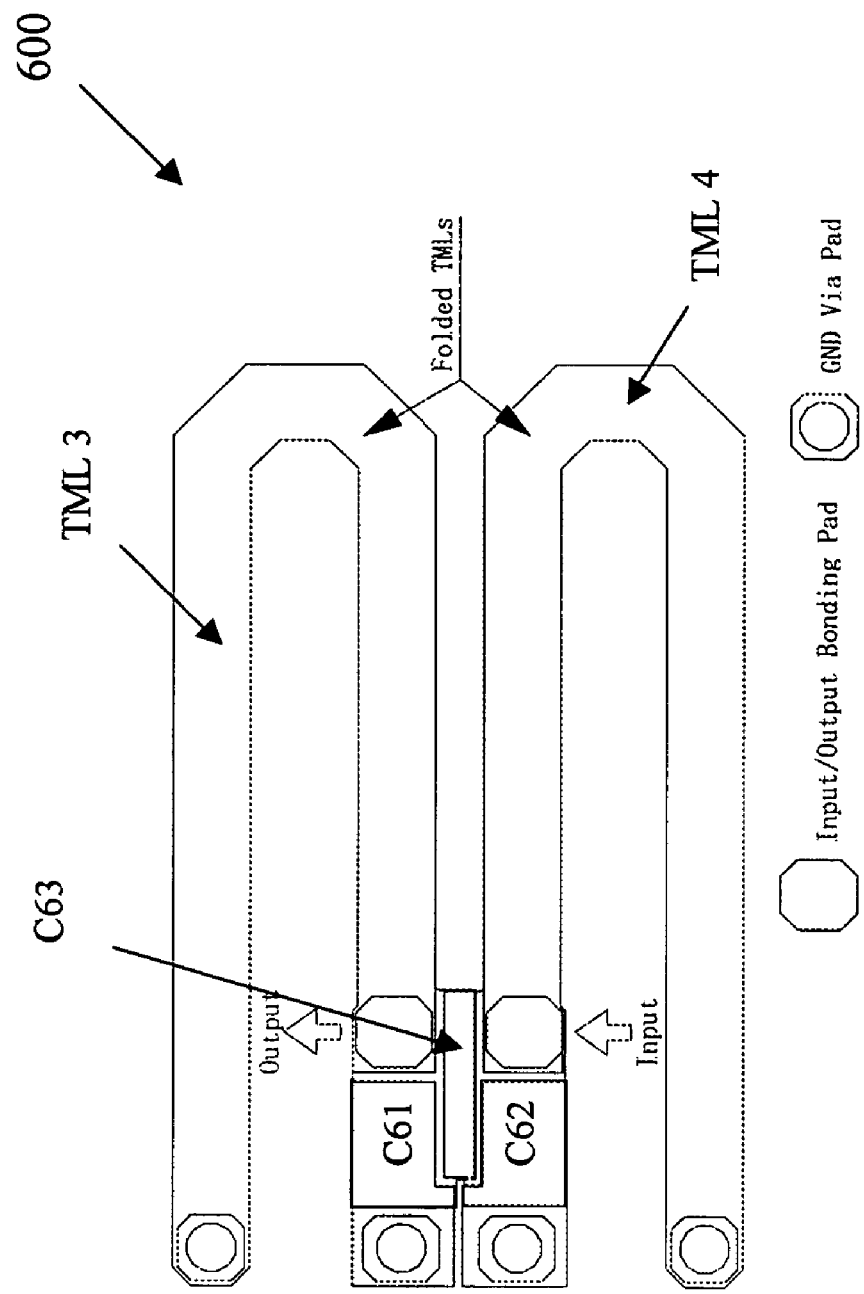
FIG. 6 illustrates another circuit layout of the frequency filter circuit of FIG. 3.

FIG. 6 illustrates another layout 600 as one implementation of the frequency filter circuit of FIG. 3. The first resonator circuit includes short-stub transmission line TML3 coupled with capacitor C61. The second resonator circuit includes short-stub transmission line TML4 coupled with capacitor C62. The non-coupling ends of TML3, TML4, C61, C62 are grounded at grounding pads. The two resonator circuits are coupled by capacitor C63. Short-stub transmission lines TML3 and TML4 are folded in a hairpin like shape. The folded transmission lines can form a substantially symmetric structure. Similar to layout 500, the effective lengths of the folded transmission line TML3 and TML4 are about one quarter of the resonance wavelengths of the respective resonator circuits, which can be precisely fabricated on a semiconductor substrate using microfabrication techniques.

Figure 7:
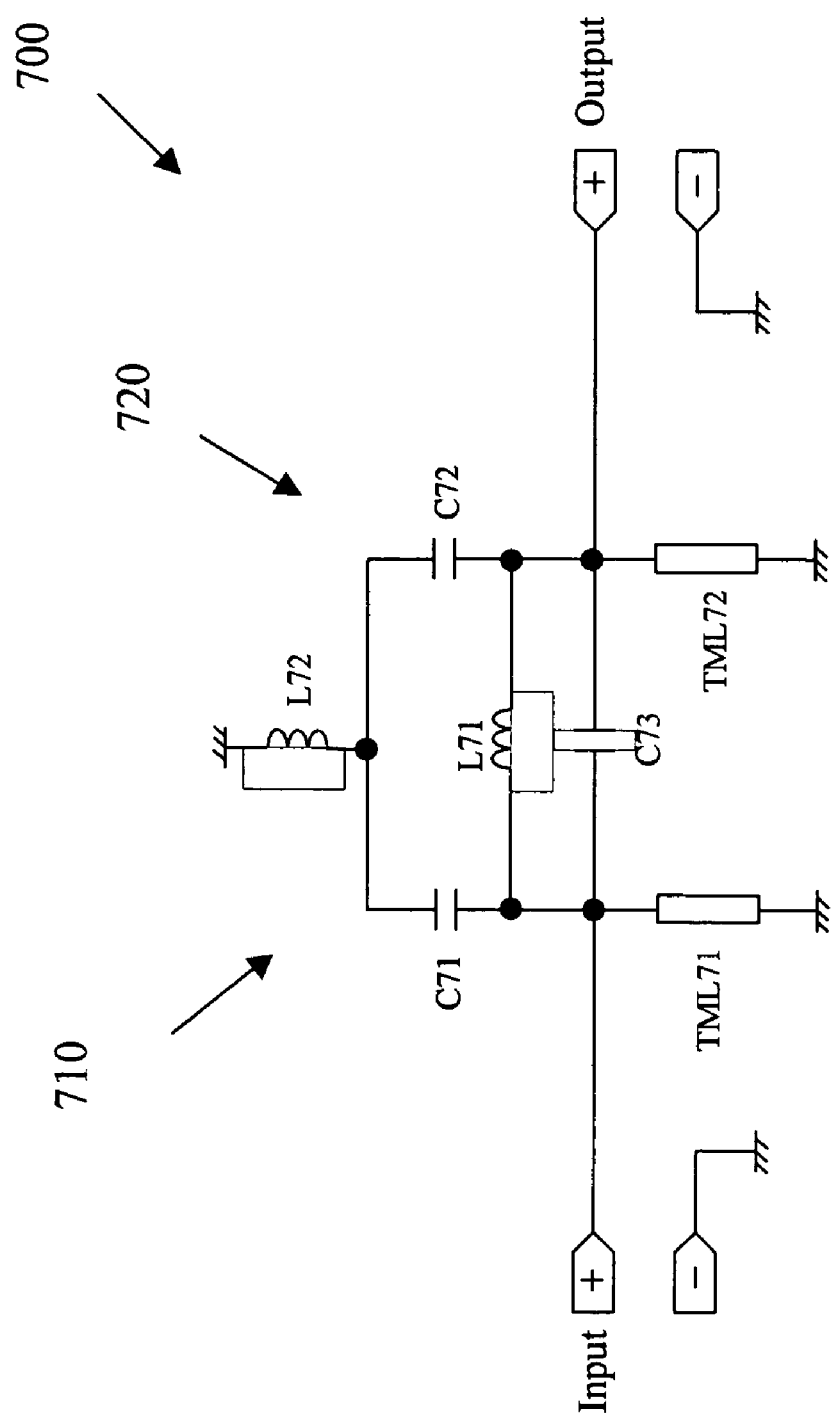
FIG. 7 illustrates another arrangement of a frequency filter circuit comprising transmission lines for wireless communications.

FIG. 7 illustrates another arrangement of a frequency filter circuit compatible with wireless modules 100, 200 in FIGS. 1 and 2. Frequency filter circuit 700 includes an input, an output, a resonator circuit 710 and a resonator circuit 720 in parallel to the resonator circuit 710. The resonator circuit 710 comprises a transmission line TML71 and a first capacitor C71 coupled to the transmission line TML71. The second resonator circuit 720 includes a transmission line TML72 and a capacitor C72 coupled to the transmission line TML72. A capacitor C73 and an inductor L71 form a parallel circuit that couples the first resonator circuit 710 and the second resonator circuit 720. The non-coupling ends of the capacitor C71 and capacitor C72 are both grounded at ground pads.

Figure 8:
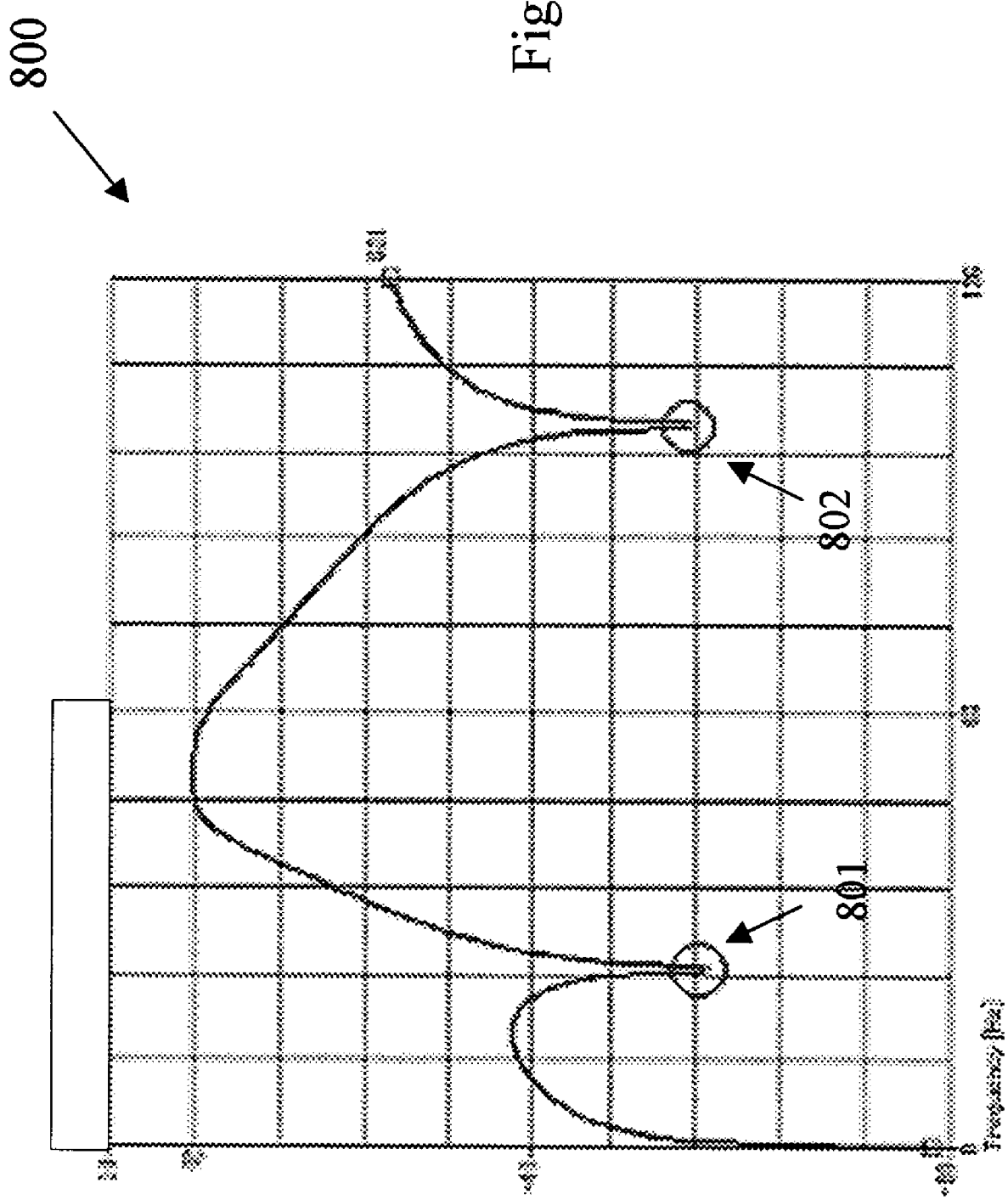
FIG. 8 illustrates the frequency response performance of the frequency filter circuit of FIG. 7.

The frequency response performance 800 of the frequency filter circuit 700 is shown in FIG. 8. The peak frequency defines the central frequency of the pass band. In accordance with the present invention, the frequency filtering circuits can produce a frequency pass band around a peak frequency such as 2 GHz or 5 GHz, frequency band. A noted advantage in the frequency performance of the frequency filter circuit 700 is the sharp downward notches 801 and 802 that form in the stop regions beside the pass band. The sharp downward notches 801 and 802 are a result of the electromagnetic interference through the coupling inductance L71 and L72 between the two resonator circuits 710 and 720 in FIG. 7.

In accordance with the present invention, frequency filtering circuits and diplexers can be fabricated on a passive semiconductor substrate. Transistors can be fabricated on an active semiconductor substrate. Details about fabricating wireless modules on passive and active semiconductor substrates are disclosed in the above referenced U.S. patent application Ser. No. 10/804,737, filed Mar. 18, 2004, "RF front-end module for wireless communication devices" by Ichitsubo et al., the disclosure of which and related applications is incorporated herein by reference.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

What is claimed is:

1. A frequency filtering circuit fabricated on an integrated circuit for wireless communications, comprising
   a first resonator circuit comprising a first transmission line and a first capacitor coupled to the first transmission line integrated on a semiconductor substrate using semiconductor deposition on the integrated circuit;
   a second resonator circuit in parallel to the first resonator circuit, said second resonator circuit comprising a second transmission line and a second capacitor coupled to the second transmission line; and
   a coupling circuit that couples the first resonator circuit and the second resonator circuit as part of a diplexer, wherein the coupling circuit includes a third capacitor; and a first inductor in parallel to the third capacitor, wherein the third capacitor and the first inductor are coupled to the first transmission line and the second transmission line.

2. The frequency filtering circuit of claim 1, further comprising a second inductor that is connected grounded at one end and is coupled with the first capacitor and the second capacitor at another end.

3. The frequency filtering circuit of claim 1, wherein the first transmission line is grounded at first end and is connected to the first capacitor at the second end.

4. The frequency filtering circuit of claim 1, wherein the coupling circuit couples with the first resonator circuit at the first end of the first transmission line.

5. The frequency filtering circuit of claim 1, wherein the second transmission line is grounded at first end and is connected to the second capacitor at the second end.

6. The frequency filtering circuit of claim 1, wherein the coupling circuit couples with the second resonator circuit at the first end of the second transmission line.

7. The frequency filtering circuit of claim 1, wherein the layout of first transmission line or the second transmission line includes a folded hairpin geometry.

8. The frequency filtering circuit of claim 1, wherein the layout of the first transmission line and the second transmission line include substantially symmetric folded hairpin geometries.

9. The frequency filtering circuit of claim 1, wherein the length of the first transmission line is substantially one quarter of the wavelength of the resonant frequency of the first resonator circuit.

10. The frequency filtering circuit of claim 1, further comprising:
    input electric signals provided to the first resonator circuit; and
    output electric signals received from the second resonator circuit in response to the input electric signals, wherein the frequency performance function of the output electric signals includes at least one downward notch at a frequency adjacent to one side the pass band.

11. The frequency filtering circuit of claim 10, wherein the frequency performance function of the output electric signals forms a pass band around a peak frequency.

12. The frequency filtering circuit of claim 11, wherein the peak frequency is about 2 GHz or 5 GHz.

13. A wireless communications integrated circuit device, comprising:
    a semiconductor substrate;
    a frequency filtering circuit, comprising
       a first resonator circuit comprising and a first transmission line fabricated on the semiconductor substrate using semiconductor deposition on the semiconductor substrate and a first capacitor coupled to the first transmission line;
       a second resonator circuit in parallel to the first resonator circuit, said second resonator circuit comprising a second transmission line fabricated on the semiconductor substrate and a second capacitor coupled to the second transmission line; and
       a coupling circuit that couples the first resonator circuit and the second resonator circuit as part of a diplexer, wherein the coupling circuit includes a third capacitor; and a first inductor in parallel to the third capacitor, wherein the third capacitor and the first inductor are coupled to the first transmission line and the second transmission line; and
    one or more amplifiers coupled to the diplexer.

14. The wireless communications device of claim 13, wherein the frequency filtering circuit is fabricated on the semiconductor substrate.

15. The wireless communications device of claim 13, wherein the semiconductor substrate is a passive semiconductor substrate.

16. The wireless communications device of claim 13, wherein the coupling circuit includes a second inductor that is connected grounded at one end and is coupled with the first capacitor and the second capacitor at another end.

17. The wireless communications device of claim 13, wherein the first transmission line is grounded at first end and is connected to the first capacitor at the second end.

18. The wireless communications device of claim 13, wherein the coupling circuit couples with the first resonator circuit at the first end of the first transmission line.

19. The wireless communications device of claim 13, wherein the second transmission line is grounded at first end and is connected to the second capacitor at the second end.

20. The wireless communications device of claim 13, wherein the coupling circuit couples with the second resonator circuit at the first end of the second transmission line.

21. The wireless communications device of claim 13, wherein the layout of first transmission line or the second transmission line includes a folded hairpin geometry.

22. The wireless communications device of claim 13, wherein the layout of the first transmission line and the second transmission line include substantially symmetric folded hairpin geometries.

23. The wireless communications device of claim 13, wherein the length of the first transmission line is substantially one quarter of the wavelength of the resonant frequency of the first resonator circuit.

24. The wireless communications device of claim 13, further comprising:
    input electric signals provided to the first resonator circuit; and
    output electric signals received from the second resonator circuit in response to the input electric signals, wherein the frequency performance function of the output electric signals includes at least one downward notch at a frequency adjacent to one side the pass band.

25. The wireless communications device of claim 24, wherein the frequency performance function of the output electric signals forms a pass band around a peak frequency.

26. The wireless communications device of claim 25, wherein the peak frequency is about 2 GHz or 5 GHz.

* * * * *